(12) United States Patent
Wang et al.

(10) Patent No.: US 7,755,880 B2
(45) Date of Patent: Jul. 13, 2010

(54) HOUSING FOR ELECTRONIC DEVICE AND METHOD OF MAKING THE SAME

(75) Inventors: Chun-Bao Wang, Shenzhen (CN); Jie Tang, Shenzhen (CN); Jin-Lin Qiu, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 243 days.

(21) Appl. No.: 11/933,965

(22) Filed: Nov. 1, 2007

(65) Prior Publication Data

US 2008/0297989 A1    Dec. 4, 2008

(30) Foreign Application Priority Data

Jun. 1, 2007    (CN)    ................ 2007 1 0074805

(51) Int. Cl.
*G06F 1/16*    (2006.01)

(52) U.S. Cl. ............... 361/679.01; 439/502; 257/679; 174/262

(58) Field of Classification Search ............ 439/502, 439/528, 357; 257/622, 679, 680; 29/593, 29/852, 854; 174/261, 262; 361/679.01, 361/679.37
See application file for complete search history.

(56) References Cited

U.S. PATENT DOCUMENTS

| 6,570,102 | B2 * | 5/2003 | Miller et al. ............... 174/261 |
| 6,600,214 | B2 * | 7/2003 | Ishikawa et al. ........... 257/622 |
| 7,044,775 | B2 * | 5/2006 | Yang ........................ 439/502 |

FOREIGN PATENT DOCUMENTS

CN    1182584 C    12/2004

* cited by examiner

*Primary Examiner*—Hung V Duong
(74) *Attorney, Agent, or Firm*—Jeffrey T. Knapp

(57) ABSTRACT

A housing (100) for an electronic device includes an opaque base (10). The base has a plurality of blind holes (120) and a number of through holes (140) defined therein. Each through hole communicates with a corresponding blind hole. The through holes are arrayed in a determined pattern.

18 Claims, 3 Drawing Sheets

HOUSING FOR ELECTRONIC DEVICE AND METHOD OF MAKING THE SAME

BACKGROUND OF THE INVENTION

1. Field of the Invention

The present invention relates generally to housings, and particularly to a housing for an electronic device and a method of making the same.

2. Description of Related Art

With the development of wireless communication and information processing technologies, portable electronic devices, such as mobile telephones and personal digital assistants (PDAs), are now in widespread use. Since the electronic device ares carried as an everyday item, the appearance and tactile feel of the electronic device can be an important part of its appeal. Generally, producers apply spray painting or baked-on varnish to the housing of the electronic device so as to improve the appearance of the electronic device. However, the paint may easily be worn off, thus affecting the appearance of the electronic device.

Therefore, a new housing for electronic device is desired in order to overcome the above-described problems.

SUMMARY OF THE INVENTION

In one embodiment thereof, a housing is applied to an electronic device and includes an opaque base. The base has a plurality of blind holes and a number of through holes defined therein. Each through hole communicates with a corresponding blind hole. The through holes are arrayed in a pattern.

Other advantages and novel features will become more apparent from the following detailed description when taken in conjunction with the accompanying drawings.

BRIEF DESCRIPTION OF THE DRAWINGS

Many aspects of the housing for electronic device can be better understood with reference to the following drawings. The components in the drawings are not necessarily drawn to scale, the emphasis instead being placed upon clearly illustrating the principles of the present housing. Moreover, in the drawings, like reference numerals designate corresponding parts throughout the several views.

DETAILED DESCRIPTION OF THE INVENTION

Figure 1:
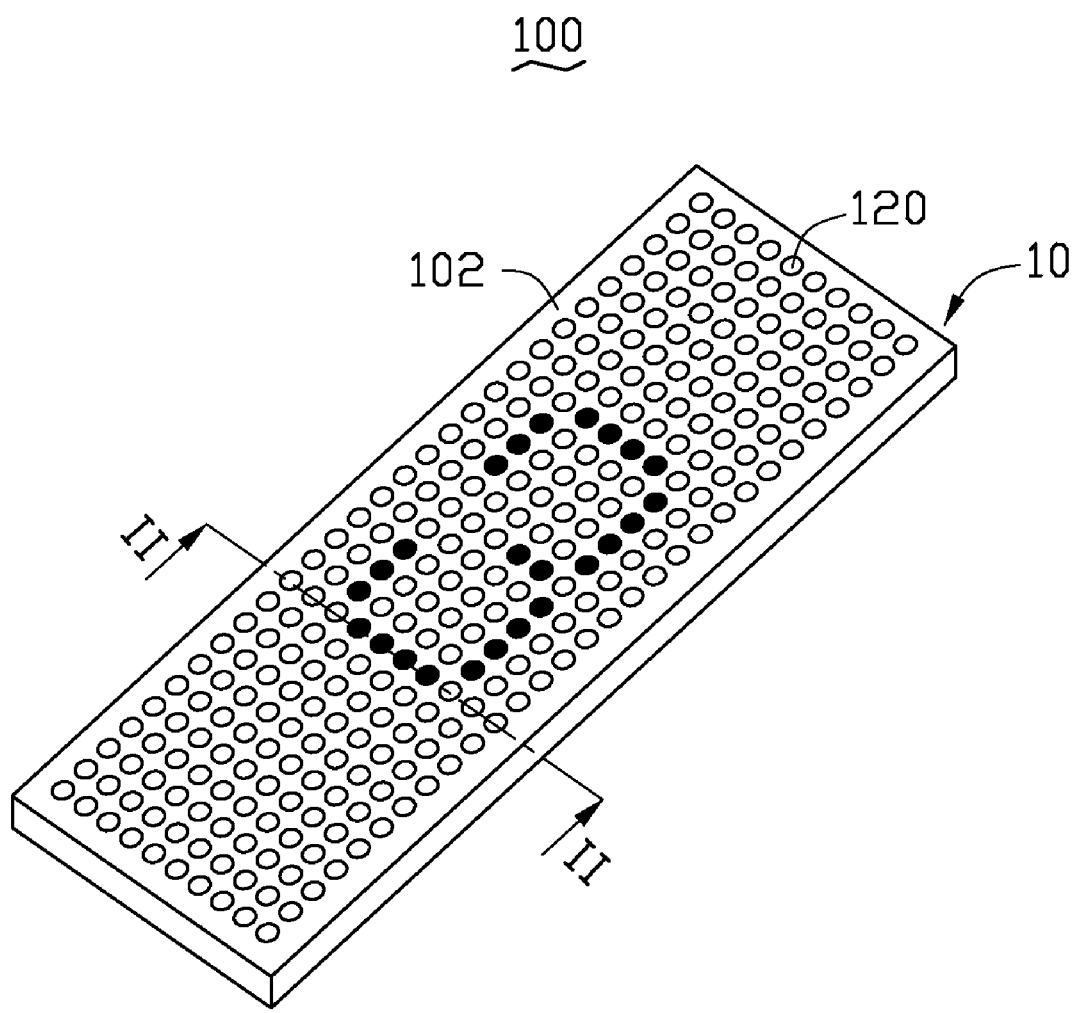
FIG. 1 is an isometric view of a housing, in accordance with a first embodiment of the present invention.
Figure 2:
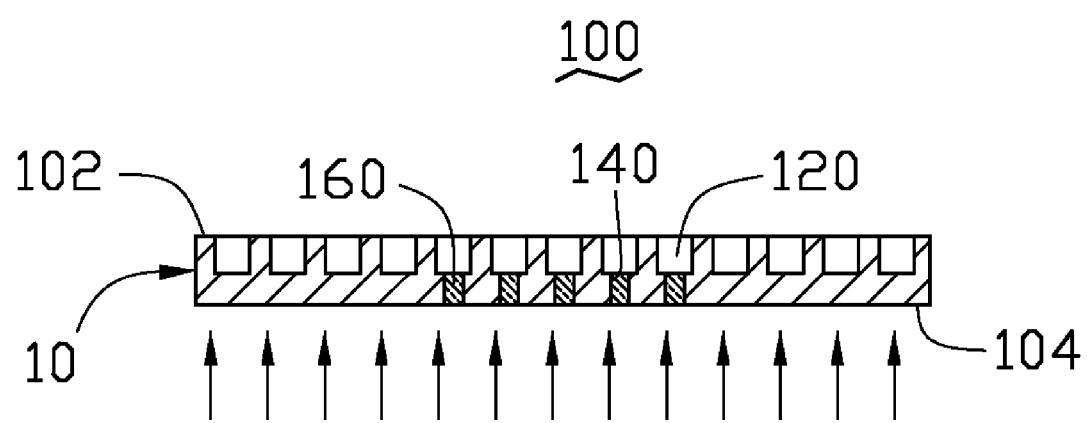
FIG. 2 is a cross-sectional view taken along line II-II of FIG. 1.

Referring now to FIGS. 1 and 2, a housing 100 applied to an electronic device (not shown) includes a base 10, in accordance with a first embodiment of the present invention. The base 10 is opaque and generally a flat board. The base 10 is made of metal in this embodiment, and has an upper surface 102 and a lower surface 104. A plurality of circular blind holes 120 are defined in the upper surface 102. A diameter of each blind hole 120 is about 0.3 mm, and the depth of each blind hole 120 is about 0.1~0.2 mm. A number of circular through holes 140 are defined in the lower surface 104 and arrayed in pattern (e.g., landscape, portrait, and so on). Each through hole 140 communicates with a corresponding blind hole 120. A diameter of each through hole is much smaller than the blind hole 120. Some transparent filler 160 is inserted into each through hole 140 so as to avoid water or dust coming inside. Since each through hole 140 is small, the through holes 140 are hard for a user to see from outside. During use the electronic device gives out light from inside. The light escapes from the through holes 140 of the housing 100, so as to show the pattern brightly.

A method of manufacturing the housing 100 includes steps as follow:

(1) providing a pressing machine to punch a metal so as to form the base 10;

(2) using a laser engraving machine to carve the base 10 so as to form a plurality of blind holes 120 and a number of through holes 140, each blind hole 120 communicating with a given blind hole 120;

(3) polishing the surface of the base 10 using a polish tool; and (4) clearing the base 10 and filling some transparent filler 160 into the through holes 140 for forming the housing 100.

In step (1), a height of the base 10 is about 0.5 mm, and the base 10 is a flat board.

In step (2), a diameter of each blind hole 120 is about 0.3 mm and the depth of each blind hole 120 is about 0.1~0.2 mm. A diameter of each through hole 140 is about 0.2 mm, and the through holes 140 are arrayed in a determined pattern.

In step (3), the polishing tool has a polishing cloth used to polish the housing 10, wherein some lubricant is attached to the polishing cloth during polishing. Due to the polishing, irregularities formed on the surface of the base 10 gradually disappear. Thus, the surface of the base 10 becomes more smoother.

Figure 3:
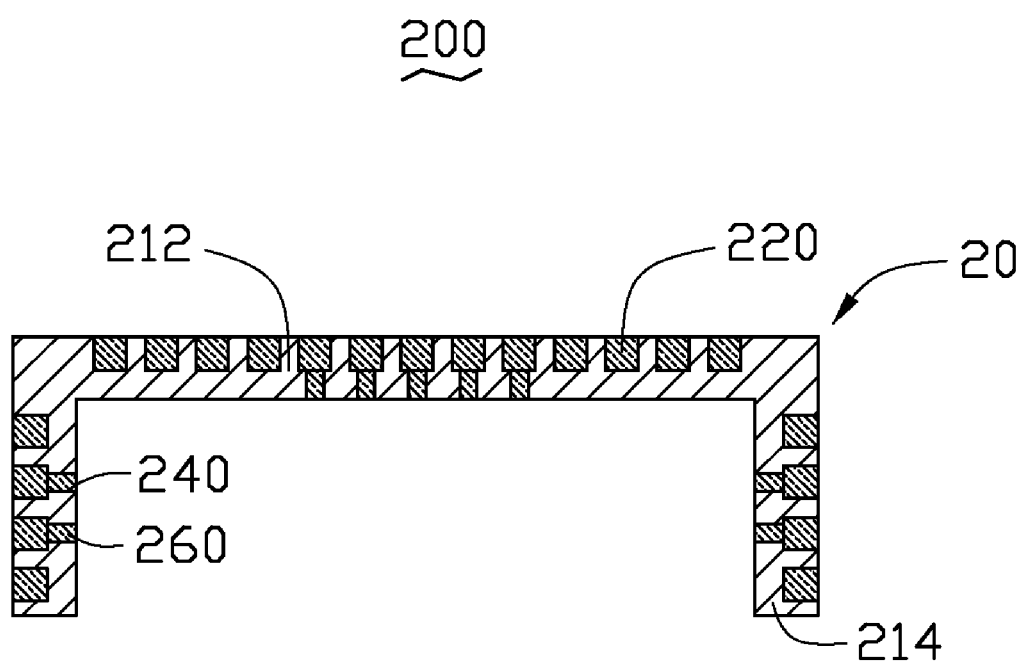
FIG. 3 is a cross-sectional view of a housing, in accordance with a second embodiment of the present invention.

In a second embodiment of the present invention, referring to FIG. 3, the housing 200 includes a base 20. The base 20 has a plate 212 and two sidewalls 214 respectively extending from two sides of the plate 212. A plurality of blind holes 220 are defined in the plate 212 and the two sidewalls 214. A number of through holes 240 are formed in the plate 212 and the two sidewalls 214, and each through hole 240 communicates with a corresponding blind hole 220. The through holes 240 are arrayed in a pattern. Each through hole 240 and each blind hole 220 are filled with transparent filler 260, so that dust and other contaminants cannot enter into the blind hole 220.

It should be understood that the blind holes 120, 220 may be other shape, such as rectangular, rhomboid and so on.

It also should be understood that the diameter of the blind holes 120, 220 or the through hole 140, 240 may be changed according to requirement.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A housing for an electronic device, comprising:

an opaque base having a plurality of blind holes defined therein, a number of through holes being defined in the base under some of the blind holes, each through hole communicating with a corresponding blind hole, a diameter of each through hole being smaller than the blind hole, the through holes being arrayed in a predetermined pattern, light emitted inside the electronic device escaping from the through holes to show the pattern.

2. The housing as claimed in claim 1, wherein each through hole is filled with transparent filler.

3. The housing as claimed in claim 2, wherein each blind hole is filled with transparent filler.

4. The housing as claimed in claim 1, wherein the base is made of metal.

5. The housing as claimed in claim 1, wherein each blind hole is circular.

6. The housing as claimed in claim 5, wherein each through hole is circular.

7. The housing as claimed in claim 1, wherein a diameter of each blind hole is 0.3 mm, and a diameter of each through hole is 0.2 mm.

8. The housing as claimed in claim 7, wherein a depth of each blind hole is 0.1 mm~0.2 mm.

9. A method of making a housing applied in an electronic device, comprising steps:
forming a base;
defining a plurality of blind holes in the base;
defining a plurality of through holes in the base under some of the blind holes, each through hole communicating with a corresponding blind hole, a diameter of each through hole being smaller than the blind hole, the through holes being arrayed in pattern; and
filling transparent filler in each through hole.

10. The method as claimed in claim 9, further comprising a step of filling transparent filler in each blind hole.

11. The method as claimed in claim 9, wherein the base is a metal and is formed by a pressing machine.

12. The method as claimed in claim 9, wherein the blind holes and the through holes are formed by a laser engraving machine.

13. The method as claimed in claim 9, further comprising a step of polishing the surface of the base after the through holes being defined.

14. The method as claimed in claim 13, further comprising a step of cleaning the base after polishing.

15. An electronic device, comprising:
a housing including a base, the base defining a plurality of blind holes at one side and a number of through holes at the other side, the number of the through holes being smaller than the blind holes, each through hole communicating with a given blind hole, the through holes being arrayed in a predetermined pattern; and
wherein the through hole allows light from the opposite side of the blind holes to send out and showing the pattern.

16. The electronic device as claimed in claim 15, wherein a diameter of each blind hole is 0.3 mm, and a diameter of each through hole is 0.2 mm.

17. The electronic device as claimed in claim 16, wherein a depth of each blind hole is 0.1 mm~0.2 mm.

18. The electronic device as claimed in claim 15, wherein the blind holes and the through holes are filled with transparent filler.

* * * * *